(12) United States Patent
Koizumi et al.

(10) Patent No.: US 8,410,670 B2
(45) Date of Patent: Apr. 2, 2013

(54) LAMINATE AND METHOD OF MANUFACTURING THE SAME

(75) Inventors: Takaaki Koizumi, Tajimi (JP); Naoki Ogawa, Tokai (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 13/589,459

(22) Filed: Aug. 20, 2012

(65) Prior Publication Data

US 2012/0315500 A1    Dec. 13, 2012

Related U.S. Application Data

(63) Continuation of application No. PCT/JP2012/054979, filed on Feb. 28, 2012.

(30) Foreign Application Priority Data

Mar. 25, 2011    (JP) .................. 2011-067064

(51) Int. Cl.
     *H01L 41/00*    (2006.01)
(52) U.S. Cl. ............. 310/363; 310/323.06; 310/323.11; 310/364
(58) Field of Classification Search ............. 310/323.06, 310/323.11, 363, 364
     See application file for complete search history.

(56) References Cited

U.S. PATENT DOCUMENTS

| | | | | |
|---|---|---|---|---|
| 5,430,344 A | * | 7/1995 | Takeuchi et al. | 310/330 |
| 5,984,458 A | * | 11/1999 | Murai | 347/68 |
| 6,147,438 A | * | 11/2000 | Nishiwaki et al. | 310/363 |
| 6,149,968 A | * | 11/2000 | Shimada | 427/100 |
| 7,009,328 B2 | * | 3/2006 | Kitagawa et al. | 310/363 |
| 7,069,631 B2 | * | 7/2006 | Unno et al. | 29/25.35 |
| 7,441,317 B2 | * | 10/2008 | Koizumi et al. | 29/25.35 |
| 7,581,823 B2 | * | 9/2009 | Nakanishi | 347/68 |
| 7,923,903 B2 | * | 4/2011 | Fujii et al. | 310/331 |

FOREIGN PATENT DOCUMENTS

| | | |
|---|---|---|
| JP | 04-264304 A1 | 9/1992 |
| JP | 2005-012200 A1 | 1/2005 |
| JP | 2005-200753 A1 | 7/2005 |
| JP | 2005-203761 A1 | 7/2005 |
| JP | 2006-052101 A1 | 2/2006 |
| JP | 2006-229282 A1 | 8/2006 |
| JP | 2007-123583 A1 | 5/2007 |

* cited by examiner

*Primary Examiner* — Cathy Lam
(74) *Attorney, Agent, or Firm* — Burr & Brown

(57) ABSTRACT

A laminate includes a ceramic substrate, a piezoelectric element, and an intermediate layer. The piezoelectric element includes a lower electrode. The intermediate layer is formed between the substrate and the lower electrode of the piezoelectric element. The intermediate layer contains a metal or an oxide thereof as a main component. The metal is different from a metal contained in the lower electrode. The intermediate layer further contains holes.

2 Claims, 5 Drawing Sheets

US 8,410,670 B2

LAMINATE AND METHOD OF MANUFACTURING THE SAME

CROSS-REFERENCE TO RELATED APPLICATIONS

This application claims priority to Japanese Patent Application No. 2011-067064 filed on Mar. 25, 2011 and International Application No. PCT/JP2012/054979 filed on Feb. 28, 2012. The entire disclosures of Japanese Patent Application No. 2011-067064 and International Application No. PCT/JP2012/054979 are hereby incorporated herein by reference.

FIELD OF THE INVENTION

The present invention relates to a laminate that can be applied to various electronic components such as a piezoelectric/electrostrictive element, a dielectric element, a condenser, and an actuator, and to a method of manufacturing the same.

BACKGROUND OF THE INVENTION

Various methods have been proposed for the formation of a metal film on a substrate in the conventional manufacture of an electronic component.

Patent Literature 1 (Japanese Patent Application Laid-Open No. 2006-52101) discloses, as a prior art, the enhancement of the adhesion between a substrate and a metal coating in which concavities and convexities are formed on the substrate surface with surface roughening treatment and the concavities are occupied with the metal. Patent Literature 1 discloses a method of preparing a metal coating by plating onto a metal coated ceramic substrate without use of the surface roughening treatment. The method includes a step of applying fine powders of at least two metals and/or metal oxides selected from a specified group of metal elements to a ceramic substrate surface, a step of strongly fixing the fine powders to the substrate surface using thermal treatment at 200° C. to 500° C., and a step of depositing a metal coating onto the substrate surface using the fixed fine powders as a seed layer.

Patent Literature 2 (Japanese Patent Application Laid-Open No. 2005-12200) discloses a piezoelectric/electrostrictive element including a body configured from ceramic, and an operation member having a lower electrode, a piezoelectric/electrostrictive film and an upper electrode. Patent Literature 2 discloses that inclusion of titanium in the body enables a reduction in sintering stress caused by thermal treatment between the body and the operation member, and then a large displacement is obtained.

The following problems are associated with metal coatings formed using the conventional method.

Firstly, when a ceramic layer is additionally provided over a metal coating formed on a ceramic substrate, after applying the ceramic material on the metal coating, high-temperature thermal treatment may be applied at a temperature which is greater than or equal to the particle growth initiating temperature for the particles forming the metal coating (for example, when the metal coating is made of Pt, the particle growth initiating temperature is in the vicinity of 750° C.). This type of high-temperature thermal treatment may reduce the surface smoothness due to a metal dome formation by expanding the metal film, or may reduce areas covered by the plated film due to partially breaking of the metal dome.

SUMMARY OF THE INVENTION

In light of the problems in the conventional techniques as described above, the object of the present invention is to provide a new laminate including a metal film and a ceramic substrate and a method of manufacturing the laminate.

A laminate according to a first aspect of the present invention includes a ceramic substrate; a metal film provided on the ceramic substrate; and an intermediate layer that is provided between the metal film and the ceramic substrate. The intermediate layer contains a metal and/or an oxide thereof as a main component and has a hole. The metal is different from a metal contained in the metal film.

A method of manufacture of the laminate according to another aspect of the present invention comprises the steps of: (a) forming a metal film on a ceramic substrate; (b) applying thermal treatment to the ceramic substrate and the metal film at a temperature greater than or equal to a particle growth initiation temperature of a main component metal of the metal film; and (c) arranging a metal and/or oxide thereof onto the ceramic substrate before the step (a). The metal is different from a metal contained in the metal film.

The laminate according to the present invention enables the release of gas from between a metal film and a ceramic substrate through holes in an intermediate layer, and therefore, suppresses peeling of the metal film from the ceramic substrate. Furthermore, due to a structure that includes holes, the fluidity upon sintering the metal film is improved, the residual stress that acts on the interface between the ceramic substrate and the metal film is reduced, and in particular, the long-term reliability is enhanced so that the stress is overlaid on the interface between the ceramic substrate and the metal film as in a piezoelectric/electrostrictive actuator. In addition, the method of manufacture described above is suitable as a method of manufacture for a laminate according to the present invention.

DETAILED DESCRIPTION OF THE INVENTION (1) Laminate

Figure 1:
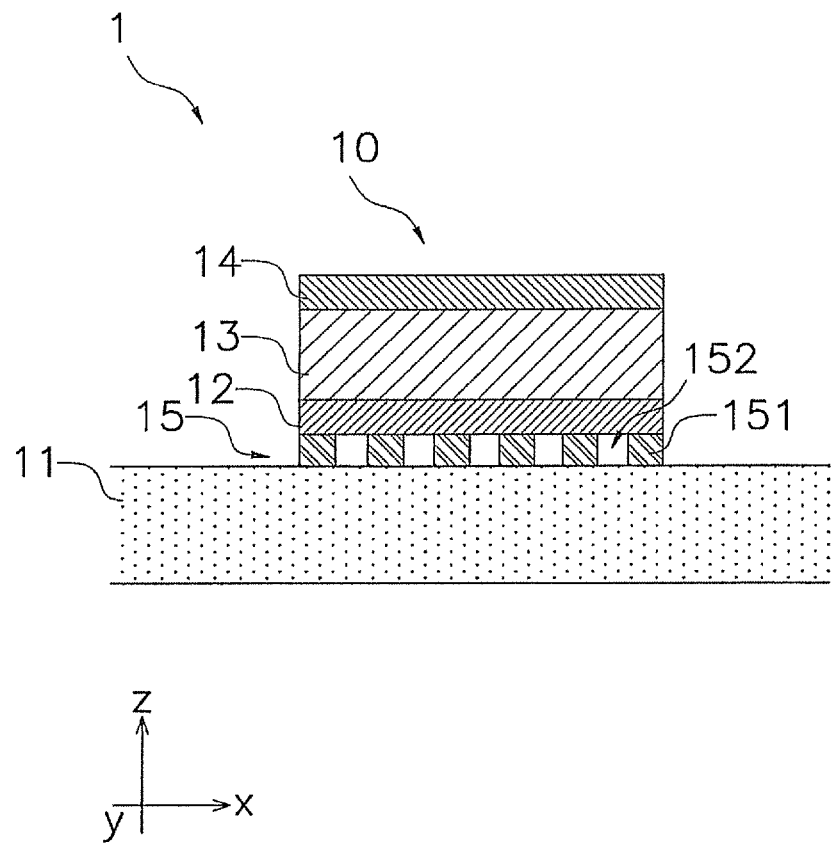
FIG. 1 is a cross sectional view of a piezoelectric/electrostrictive element according to an embodiment of the present invention.

The laminate 1 illustrated in FIG. 1 includes a piezoelectric/electrostrictive element 10, a substrate 11 and an intermediate layer 15.

The substrate 11 is an example of a ceramic substrate. In the present embodiment, the substrate 11 is a member having insulating properties, and for example, may be a sinter formed from an insulating ceramic. Examples of the insulating ceramic include at least one type of material selected from the group consisting of zirconia, alumina, magnesia, spinel, mullite, aluminum nitride, and silicon nitride. Zirconia includes configurations that are stabilized or partially stabilized by additives such as yttrium.

The piezoelectric/electrostrictive element 10 is an example of an electronic element. As illustrated in FIG. 1, the piezoelectric/electrostrictive element 10 includes a lower electrode 12, a piezoelectrics/electrostrictives 13 and an upper electrode 14. The lower electrode 12, the piezoelectrics/electrostrictives 13 and the upper electrode 14 are laminated in order with reference to the Z axis of the substrate 11. The lower electrode 12 and the upper electrode 14 are respectively wired (not illustrated).

The lower electrode 12 is an example of a metal film, and is provided on the substrate 11. The lower electrode 12 contains an electrically conductive material as a main component. The electrically conductive material includes a metal such as platinum, palladium, gold, copper, nickel, chrome, rhodium, iridium, and the like. Furthermore, a plurality of electrically conductive metals may be included as the electrically conductive material. When the metal film contains a plurality of electrically conductive metals, the total amount of the plurality of electrically conductive metals may satisfy the proportion as the main component in the lower electrode 12.

The term "contain . . . as a main component" as used herein includes containing 60 wt % or more of the component, containing 80 wt % or more of the component, or containing 90 wt % or more of the component.

The piezoelectrics/electrostrictives 13 is an example of a ceramic layer, and may be a sintered ceramic layer. A piezoelectric/electrostrictive ceramic includes a lead-containing perovskite oxide, and more specifically, includes lead zirconate titanate (PZT: $Pb(Zr_xTi_{1-x})O_3$), or a solid solution of lead zirconate titanate in a pure oxide or a composite perovskite oxide. The perovskite oxide includes $(Na,K) NbO_3$, $(Bi, Na)TiO_3$, $BaTiO_3$, and $SrTiO_3$.

Dielectrics may be used in substitution for the piezoelectrics/electrostrictives 13. Ferroelectrics are included in the dielectrics. The dielectrics include lead zirconate titanate, barium titanate and the like. Layers containing various functional materials to be used with a metal coating as an electrode may be provided in substitution for the piezoelectrics/electrostrictives 13. Examples of the various functional materials include a pyroelectric material, a thermoelectric material, a semiconductor material, an optical material.

The upper electrode 14 is provided on the piezoelectrics/electrostrictives 13. The material used in the upper electrode 14 may be selected from the same material as the lower electrode 12.

As illustrated in FIG. 1, the intermediate layer 15 is provided between the substrate 11 and the lower electrode 12. The intermediate layer 15 includes a film portion 151 and a hole 152.

The film portion 151 contains a metal and/or an oxide thereof as a main component, and the metal is different from a metal contained in the lower electrode 12 as a main component. In particular, the main component of the film portion 151 may exhibit affinity with both the substrate 11 and the lower electrode 12. Affinity may be exhibited with both the substrate 11 and the lower electrode 12, in particular, after applying thermal treatment described below. "Affinity" as used herein means a property that enhances the bonding force between the lower electrode 12 and the substrate 11, and includes physical bonding and chemical bonding due to the film portion 151.

More specifically, the main component of the film portion 151 includes aluminum, calcium, magnesium, titanium, nickel, cobalt, iron, chrome, iridium, zirconium, niobium, tantalum, zinc, copper, indium, hafnium, manganese, ruthenium, molybdenum, tungsten, tin, lead, bismuth, and silver, in addition to the oxides thereof. These materials may be used singly, or in combinations of a plurality of materials.

The film portion 151 is formed non-continuously on at least one line in the X-Y plane (the plane of the substrate 11). The intermediate layer 15 may be realized by a porous structure. However, adjacent film portions 151 may be continuous at any position in the Z-X cross-sectional portion. That is to say, the non-continuous positions correspond to the holes 152. In the Z axis direction, the holes 152 may penetrate into the intermediate layer 15 or may be obstructed by the film portion 151.

At least a portion of the holes 152 may be connected in the X-Y cross-sectional plane. That is to say, at least a portion of the holes 152 may have a network structure. It is preferred that the holes 152 are connected to release gas produced between the substrate 11 and the lower electrode 12 outside of the laminate 1. More specifically, the intermediate layer 15 preferably includes, in an X-Y cross-sectional plane, a hole 152 as a sea and a film portion 151 as an insular in the sea.

The hole 152 illustrated in FIG. 1 may also be described as a "space", a "cavity" or the like, that is to say, in FIG. 1, the hole 152 is empty and the inner portion is formed as a hollow.

Figure 2:
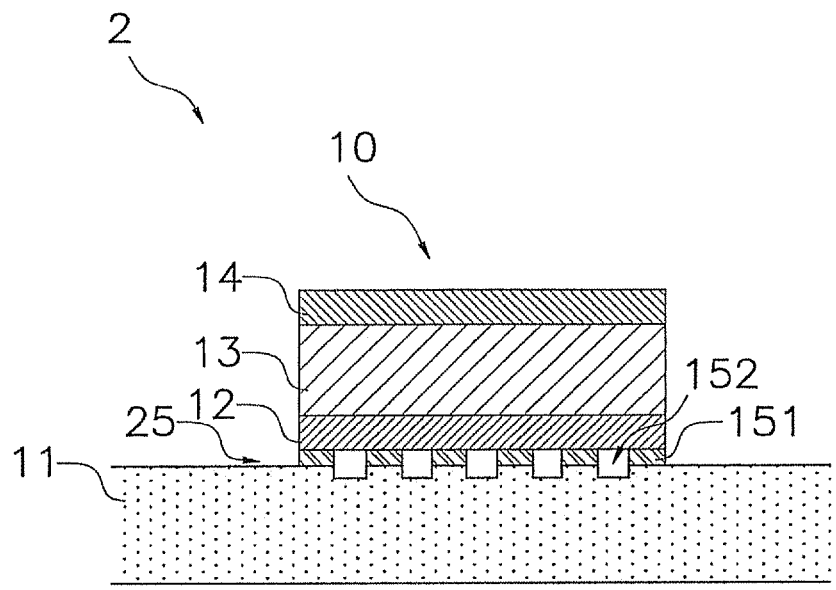
FIG. 2 is a cross sectional view of a piezoelectric/electrostrictive element according to another embodiment.
Figure 2:
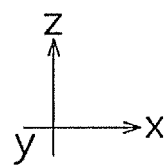

The intermediate layer may have the structure illustrated in FIG. 2. In FIG. 2, those members having the same function as the members already described with reference to FIG. 1 are denoted by the same reference numerals and description will not be repeated.

The laminate 2 illustrated in FIG. 2 includes an intermediate layer 25 in substitution for the intermediate layer 15. The surface of the substrate 11 is subjected to surface roughening treatment to form a concave-convex surface. More specifically, a concavity is formed on the surface of the substrate 11. As illustrated in FIG. 2, the holes 152 of the intermediate layer 25 may be formed inside the concavity on the surface of the substrate 11. As illustrated in FIG. 2, the film portion 151 may be formed on a convex portion (portion between concavities) on the surface of the substrate 11, or may be formed in the concavity.

Figure 3:
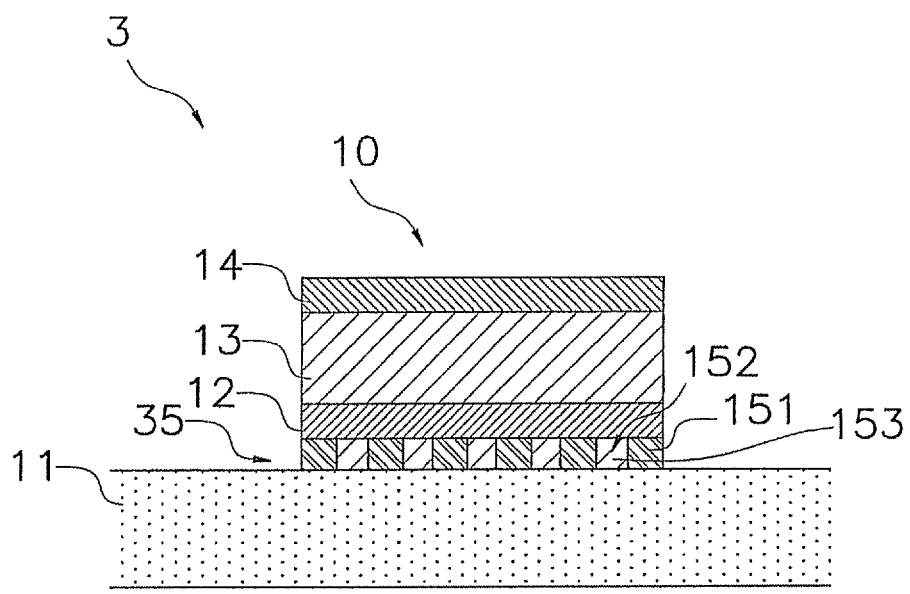
FIG. 3 is a cross sectional view of a piezoelectric/electrostrictive element according to yet another embodiment.

A ceramic material may be arranged in the holes 152 in the structure illustrated in FIG. 1 and FIG. 2. FIG. 3 illustrates a configuration in which a ceramic portion 153 is arranged in the holes 152 in the structure illustrated in FIG. 1. That is to say, an intermediate layer 35 may be provided in substitution for the intermediate layer 15, and in the intermediate layer 35, the film portion 151 and the ceramic portion 153 may be alternately arranged with reference to the X axis direction and/or the Y axis direction in a cross-sectional plane that is parallel to the Z axis direction. The ceramic portion 153 may be provided in all the holes 152 in the intermediate layer 35, or a part of the holes 152 may be hollow. Furthermore, the holes 152 may be filled by the ceramic portion 153, or a ceramic portion 153 and a hollow portion may coexist in a single hole 152.

The ceramic portion 153 may contain the same components as the main component of the piezoelectrics/electrostrictives 13, and in particular, may contain that component as the main component. Furthermore, the composition of the ceramic portion 153 may be the same as the composition of the piezoelectrics/electrostrictives 13, or may contain at least one of the components contained in the film portion 151, the substrate 11 and the lower electrode 12. In substitution for the piezoelectrics/electrostrictives 13, when another ceramic material such as a dielectric material is used, the ceramic portion 153 may contain that ceramic material as the main component.

In all of the embodiments described above, the intermediate layers 15, 25 and 35 enable release of gas through the holes 152 during the thermal treatment. In this manner, peeling of the lower electrode 12 from the substrate 11 can be suppressed.

In all of the embodiments described above, the thickness of the film portion 151 in the Z axis direction in the intermediate layers 15, 25, 35 may be 5 nm or more, or may be 10 µm or less, preferably 15nm or more and 5 µm or less, and still more preferably 20 nm or more and 1 µm or less. In addition, the thickness of the holes 152 (in other words, of the ceramic portion 153) in the Z axis direction may be 5 nm or more, or may be 10 µm or less, preferably 15 nm or more and 5 µm or less, and still more preferably 30 nm or more and 1 µm or less. When the film thickness of the intermediate layer is in this range, the bonding force between the ceramic material and the metal film can be enhanced while providing a hole for allowing discharge of gas during the thermal treatment.

In addition, a configuration of an electronic element such as a known piezoelectric/electrostrictive element may be applied, for example, in relation to the configuration of the thickness of each layer and the substrate 11.

(2) Method of Manufacture

The method of manufacture of the laminate 1 includes
(a) forming the lower electrode 12 on the substrate 11,
(b) applying thermal treatment to the substrate 11 and the lower electrode 12 at a temperature greater than or equal to the particle growth initiating temperature of a main component metal of the lower electrode 12, and
(c) arranging a metal and/or oxide thereof that is different from the lower electrode 12 onto the substrate 11 before step (a).

In the steps (a) to (c) above, the "substrate 11" and the "lower electrode 12" strictly speaking may be respectively embodied by a ceramic substrate to be a substrate 11 and a metal film to be a lower electrode 12. However, for the sake of convenience of description, the same terminology as that used in relation to the completed article will be used for a preparatory component, that is to say, a component under the manufacturing processes.

The method of manufacture will be described in further detail below.

Formation of Substrate

The formation of the substrate 11 may be realized for example by lamination of ceramic green sheets, or by powder compaction of a ceramic material. The substrate may be sintered by itself, or may be sintered after formation of other layers such as the lower electrode 12 on it.

Surface roughening treatment may be applied to the substrate 11. By the surface roughening treatment, a concave-convex surface of the substrate 11 is formed. For example, a concave-convex surface of the substrate 11 may be formed with a nano-implant method before sintering the substrate 11, or may be formed with a treatment using an acid such as hydrofluoric acid after sintering the substrate 11. The surface roughening treatment may be performed either before or after the sintering of the substrate 11. By subjecting the surface roughening treatment, the holes 152 described below are most likely to be formed and a gas release effect is most likely to be obtained.

Formation of Lower Electrode

In step (a) above, the lower electrode 12 may be formed using a variety of methods including an electro-plating method, an electroless plating method, a vapor deposition method such as sputtering or resistive heating vapor deposition, screen printing using an electrically conductive paste, spin coating using an electrically conductive resinated solution, or a spraying method. The conditions used in an electroless plating method are set so that the material is deposited depending on the material that forms the lower electrode 12.

Formation of Intermediate Layer on Substrate

In step (c) above, a metal material (including a metal oxide) that forms the film portion 151 is applied to the substrate 11. The film material layer (intermediate layer) may be formed in a substantially equal configuration on the substrate 11. For example, in case the substrate 11 is subjected to surface roughening treatmenting, a concavity may be occupied by the film material and the film material may be arranged on the convex portion as well. A component other than the film material may be included in the layer.

The thickness of the film material layer may be 5 nm or more, 15 nm or more, or 20 nm or more, and may be 10 µm or less, 5 µm or less, or 1 µm or less.

Examples of a process of forming the film material layer include various processes, i.e., a vapor deposition process such as sputtering or resistive heating vapor deposition, screen printing using electrically conductive pastes, spin coating using electrically conductive resinated solutions, a spraying process, and the like.

After formation of the film material layer and the lower electrode 12, the substrate 11 is thermally treated in step (b). A temperature that is greater than or equal to the particle growth initiating temperature for the metal forming the lower electrode 12 may be a temperature of Tm/3 (K) or more, and may be a temperature of Tm/2 (K) or more. Tm is the melting point of the metal material being the main component of the lower electrode 12. The particle growth may also be described as crystalline particle growth.

The thermal treatment may be subjected after formation of the layers other than the lower electrode 12 (for example, a ceramic layer such as piezoelectrics/electrostrictives 13, or the upper electrode 14).

The holes 152 are formed by applying the thermal treatment to the film material layer formed in the step (c), and the intermediate layer 15 is formed. The intermediate layer 25 is formed in the same manner. The holes 152 may be formed to have greater than 1 of the ratio of the length in the substrate surface direction to the length in the thickness direction (surface direction/thickness direction) in the cross-sectional planes of the hole 152, by adjusting the thickness of the intermediate layer. In that case, it is further preferred that the metal material used in the intermediate layer (including the metal oxide thereof) is selected from materials having a lower particle growth initiating temperature than the particle growth initiating temperature of the metal film of the lower electrode. Furthermore, as described above, by subjecting the surface roughening treatment, the above ratio seemingly greater than 1 may be easily obtained, and then, the holes may be easily formed and a gas release effect may be easily obtained. The hole 152 in cross section preferably has the length in the substrate surface direction of 5 nm to 10 µm and the length in the thickness direction of 5 nm to 10 µm, and more preferably the length in the substrate surface direction of 20 nm to 1 µm and the length in the thickness direction of 20 nm to 1 µm.

When additional thermal treatment is subjected on the lower electrode 12 after formation of the piezoelectrics/electrostrictives 13, a portion of the material configuring the piezoelectrics/electrostrictives 13 displaces into the hole 152 and forms a ceramic portion 153.

Formation of the intermediate layer 15 provided with the holes 152 in this manner enables gas to be released from the laminate 1 through the holes 152. The same comments apply to the intermediate layers 25 and 35. As a result, peeling of the lower electrode 12 from the substrate 11 can be suppressed.

Formation of Ceramic Layer

The formation of piezoelectrics/electrostrictives 13 and a ceramic layer that can be provided in substitution for the piezoelectrics/electrostrictives 13 may be executed by lamination of a ceramic green sheet, and a coating of a ceramic paste. The paste contains a ceramic material and a binder. The binder may be for example a butyral resin, a cellulose resin, an acryl resin, or the like. A plurality of types of binders may be mixed. Although there is no particular limitation on the method of coating the ceramic paste, examples of the method include a wet process coating such as a spin coat, a slit coat, a roll coat, a sol-gel method, a spray method and a screen printing method, and an electrophoresis method in which the lower electrode pattern is used as an electrode.

Formation of Upper Electrode

The formation of the upper electrode 14 may be performed using various methods including an electro-plating method, an electroless plating method, a vapor deposition method such as sputtering and resistive heating vapor deposition, screen printing using an electrically conductive paste, spin coating using an electrically conductive resinated solution, a spraying method, or the like.

EXAMPLES

A. Examples 1 to 10 and Comparative Examples 1 to 5

Preparation of Test Sample (1) Example 1

A surface roughening treatment was subjected using hydrofluoric acid to a surface of a zirconia substrate having a size of 30 mm×20 mm and a thickness of 0.2 mm.

A negative photoresist PMER-N manufactured by Tokyo Ohka Kogyo Co., Ltd. was coated onto the surface of the substrate recieved the surface roughening treatment. Then a resist pattern for exposure of a 2×2 mm substrate surface was formed by exposure and developing.

Next, a metal titanium film was formed on the resist pattern to have a thickness of 50 to 60 nm using a magnetron sputtering apparatus manufactured by Anelva Co., Ltd.

After that, a platinum film was formed to have a thickness of 5 nm as a catalytic nucleus for electroless plating using the same sputtering apparatus. Next, a 2×2 mm pattern having the titanium layer and the catalytic nucleus of platinum was formed by immersing the substrate in a resist peeling solution.

Then, an electroless plating solution manufactured by NE Chemcat Corporation was adjusted to be suitable for obtaining a metal film having a desired thickness. The substrate was immersed in the plating solution maintained to a temperature of 40° C. and pH13, and left for five hours while stirring. In this manner, a zirconia substrate having a 2×2 mm Pt film on the surface-roughened surface was obtained.

In order to remove gas from the resulting Pt layer, the zirconia substrate received a thermal treatment in air at a temperature increasing to a maximum temperature of 1100° C. at a rate of 50° C./min and for two hours at 1100° C.

(2) Examples 2 to 5

Laminates were prepared using the same process as Example 1 with the exception of the composition of the ceramic substrate, the metal film formed by plating and the intermediate layer as illustrated in Table 1. A test sample using Ni and Cu plating was made by sintering at 900° C. in a reducing atmosphere. The thickness of each layer was the same as that described in Example 1.

(3) Examples 6 to 10

Laminates were prepared to have the same compositions of the ceramic substrate, the metal film formed by plating and the intermediate layer and using the same process as those in Examples 1 to 5 with the exception that surface roughening was not performed. The thickness of each layer was the same as that described in Example 1.

(4) Comparative Examples 1 to 5

Laminates were prepared using the same process as Examples 1 to 5 with the exception that nucleus of a catalyst was formed without forming an intermediate layer and thereafter a plating process was performed.

Testing

The following testing was performed and the results are shown in Table 1.

(1) The resulting ceramic substrate was observed using a metallographical microscope, and examined for the presence of external faults.
(2) The bonding strength of the metal coating of those samples which did not exhibit an external fault was measured using a Sebastian method.

Firstly, a 2×2 mm metal film formed by plating was bonded by soldering with an aluminum wire.

The substrate was fixed on a tensile tester, and the aluminum wire connected with the metal film was drawn to thereby measure the load when the metal film peeled from the substrate.

(3) The fine structure in the laminate's cross-section was observed using an FE-SEM/EDS manufactured by JEOL.

Results

As illustrated in Table 1, when an intermediate layer was formed between the substrate and the metal film, an external abnormality was not observed after the thermal treatment and an improvement in bonding strength was observed.

When the fine structure in the cross-section was observed, the intermediate layer having the cavity portion and the film portion was formed on the interface between the substrate and the metal film (not illustrated). In particular, a space was formed in the concavity formed by surface roughening, and the film portion was formed on the top of the protruding portion. The film portion is considered to function as a bonding portion for bonding of the ceramic substrate and the metal film.

TABLE 1

|  | Ceramic substrate | Intermediate layer | Metal film | External examination | Bonding strength (kg/2 square millimeters) |
| --- | --- | --- | --- | --- | --- |
| Example 1 | zirconia | Ti | Pt | No abnormality | 4.6 |
| Example 2 | zirconia | Al | Pd/Pt | No abnormality | 5.2 |
| Example 3 | alumina | Ni | Pd | No abnormality | 3.9 |
| Example 4 | alumina | Cr | Ni | No abnormality | 7.1 |
| Example 5 | magnesia | Zn | Cu | No abnormality | 5.5 |
| Example 6 | zirconia | Ti | Pt | No abnormality | 5.3 |
| Example 7 | zirconia | Al | Pd/Pt | No abnormality | 6.0 |
| Example 8 | alumina | Ni | Pd | No abnormality | 3.5 |
| Example 9 | alumina | Cr | Ni | No abnormality | 6.8 |
| Example 10 | magnesia | Zn | Cu | No abnormality | 5.5 |
| Comparative Example 1 | zirconia | None | Pt | Swelling | 2.0 |
| Comparative Example 2 | zirconia | None | Pd/Pt | No abnormality | 1.8 |
| Comparative Example 3 | alumina | None | Pd | Pore | 0.9 |
| Comparative Example 4 | alumina | None | Ni | Peeling | Not measurable |
| Comparative Example 5 | magnesia | None | Cu | Peeling | Not measurable |

B. Examples 11 and 12 and Comparative Example 6

Preparation of Test Sample (1) Example 11

Using substantially the same operation as Example 1, a zirconia substrate having a size of 30 mm×20 mm and a thickness of 0.2 mm was subjected to surface roughening, formation of a titanium layer, formation of a Pt catalytic nucleus, formation of a Pt film by electroless plating, and subjected to thermal treatment to thereby obtain a zirconia substrate having a 30×20 mm Pt film with a thickness of 5 nm. The thickness of the titanium film was the same as Example 1.

Next, on the substrate, a ceramic paste prepared by mixing 20 Bi(Ni, Nb)$O_3$-80 Pb(Zr, Ti)$O_3$ powder added 3% of LiF with a butyral binder and terpineol was coated to a thickness of 5 μm within a 20×20 mm in area using a screen printing method.

The substrate with the coating of ceramic paste was sintered at a temperature increasing to a maximum temperature of 950° C. at a rate of 500° C./hour and then, sintered at 950° C. for two hours.

Further, a 15×20 mm Au film was formed by sputtering as the upper electrode.

After formation of the Au film, the film was cut into 30×5 mm pieces using a dicer, to thereby prepare a unimorph-type piezoelectric element. Three of the same elements were prepared.

(2) Example 12

A piezoelectric element was prepared using the same process as Example 11 with the exception that the added amount of LiF was 1% and the maximum temperature was 1050° C. The thickness of each layer was the same as those described in Example 11.

(3) Comparative Example 6

Three piezoelectric elements were obtained using the same operation as Example 11 with the exception that a titanium layer as the intermediate layer was not formed.

Testing

Figure 4:
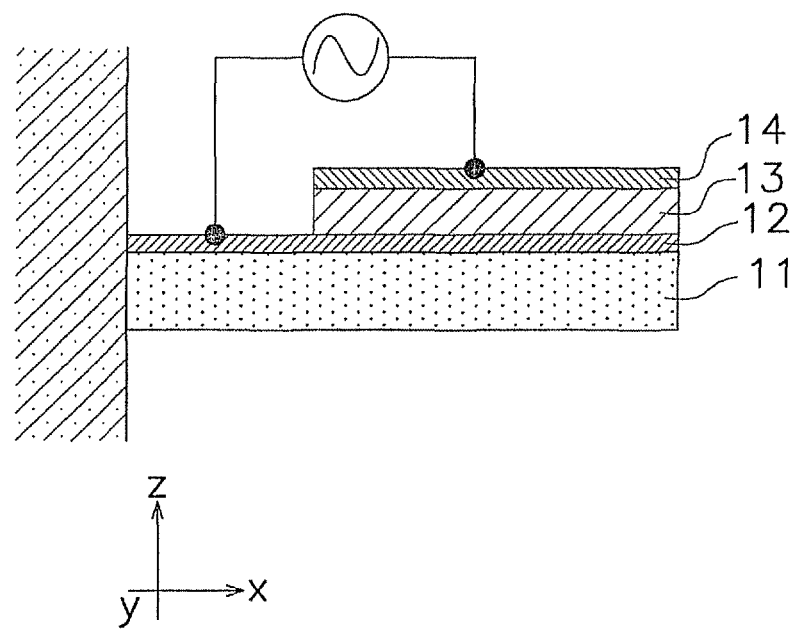
FIG. 4 is a cross sectional view illustrating the configuration of a piezoelectric cantilever prepared in accordance with the examples.
Figure 5:
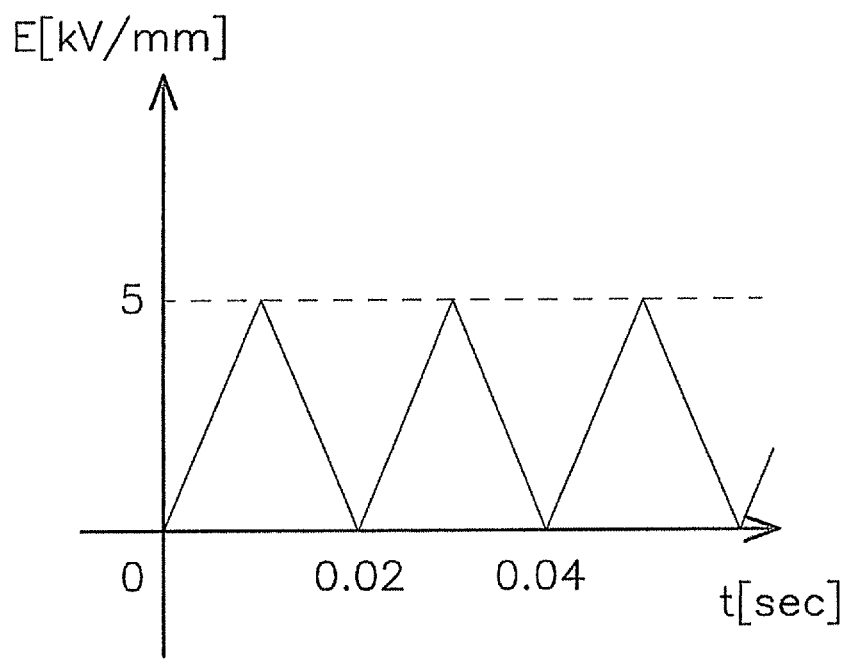
FIG. 5 is a graph illustrating a triangular waveform applied to the piezoelectric cantilever.

A piezoelectric cantilever was prepared by fixing one side of the substrate of the resulting piezoelectric element (FIG. 4). A triangular wave (FIG. 5) having a field strength of +5 kV/mm was driven for a maximum of 40 hours at 50 Hz between the upper electrode and the lower electrode, and an external examination was conducted before and after testing. The intermediate layer is omitted from FIG. 4. When the driving operation failed during testing, the test was ended at that point of time.

Results

As illustrated in Table 2, the piezoelectric element provided with an intermediate layer can operate for a long time in comparison to a piezoelectric element not provided with an intermediate layer. That is to say, the piezoelectric element that includes an intermediate layer exhibits conspicuously enhanced reliability. Furthermore, when the cross-sectional structure of the piezoelectric element in Example 11-1 was observed, the holes in the intermediate layer were filled with components of the piezoelectrics. When the cross-sectional structure of Example 12-1 was observed, the holes in the intermediate layer were not filled with components of the piezoelectrics.

TABLE 2

|  |  | Pre-test Examination | Post-test Examination (testing time) |
| --- | --- | --- | --- |
| Example 11 | -1 | No abnormality | No abnormality (40 hours) |
|  | -2 | No abnormality | No abnormality (40 hours) |
|  | -3 | No abnormality | No abnormality (40 hours) |
| Example 12 | -1 | No abnormality | No abnormality (40 hours) |
|  | -2 | No abnormality | No abnormality (40 hours) |
|  | -3 | No abnormality | No abnormality (40 hours) |
| Comparative Example 6 | -1 | Swelling | Insulation damage (3 hours) |
|  | -2 | Swelling | Peeling (5 hours) |
|  | -3 | No abnormality | 40% peeling of element (40 hours) |

In accordance with the laminate of the present invention, a laminate is provided that suppresses peeling of a metal film from a ceramic substrate. Furthermore, a laminate is provided that exhibits superior long-term reliability when the stress is overlaid with the interface between the ceramic material and the metal film particularly with reference to a piezoelectric/electrostrictive actuator. The method of manufacture as described above is suitable as a method of manufacture of a laminate according to the present invention.

What is claimed is:

1. A laminate comprising:
    a ceramic substrate;
    a metal film provided on the ceramic substrate; and
    an intermediate layer provided between said metal film and the ceramic substrate, the intermediate layer containing a metal and/or an oxide thereof as a main component and having a hole, the metal being different from a metal contained in said metal film; said laminate further comprising a ceramic layer provided on the metal film opposite to the ceramic substrate, wherein said intermediate layer includes a ceramic material which is the same as the ceramic material contained in said ceramic layer and embedded in the hole.

2. The laminate of claim 1, wherein the metal and/or the oxide thereof in said intermediate layer has an affinity with said metal film and said ceramic substrate.

* * * * *